US011318555B2

(12) United States Patent
Richardson et al.

(10) Patent No.: US 11,318,555 B2
(45) Date of Patent: May 3, 2022

(54) CHARGED PARTICLE BEAM CONTROL DURING ADDITIVE LAYER MANUFACTURE

(71) Applicant: RELIANCE PRECISION LIMITED, West Yorkshire (GB)

(72) Inventors: William Thomas Richardson, Yorkshire (GB); Andrew McClelland, Cambridgeshire (GB); Hoyle Phil, Cambridgeshire (GB); Laidler Ian, Yorkshire (GB)

(73) Assignee: RELIANCE RG LIMITED, Huddersfield (GB)

( * ) Notice: Subject to any disclaimer, the term of this patent is extended or adjusted under 35 U.S.C. 154(b) by 446 days.

(21) Appl. No.: 16/478,293

(22) PCT Filed: Jan. 16, 2018

(86) PCT No.: PCT/GB2018/050117
§ 371 (c)(1),
(2) Date: Jul. 16, 2019

(87) PCT Pub. No.: WO2018/134576
PCT Pub. Date: Jul. 26, 2018

(65) Prior Publication Data
US 2019/0358737 A1    Nov. 28, 2019

(30) Foreign Application Priority Data
Jan. 17, 2017  (GB) ........................ 1700807

(51) Int. Cl.
*B33Y 10/00*  (2015.01)
*B33Y 30/00*  (2015.01)
(Continued)

(52) U.S. Cl.
CPC ........ *B23K 15/0086* (2013.01); *B23K 15/002* (2013.01); *B23K 15/0013* (2013.01);
(Continued)

(58) Field of Classification Search
CPC ......... B33Y 10/00; B33Y 30/00; B33Y 50/00; B23K 26/34–342; B23K 15/0046–0086
See application file for complete search history.

(56) References Cited

U.S. PATENT DOCUMENTS 6,051,179 A * 4/2000 Hagenau ................ B33Y 10/00
                                                   264/401
6,280,785 B1 * 8/2001 Yang .................... A21C 11/163
                                                   426/231
(Continued)

FOREIGN PATENT DOCUMENTS

CN         1648802 A      8/2005
CN      203164815 U       8/2013
(Continued)

OTHER PUBLICATIONS

Castelino, Kenneth, Roshan D'Souza, and Paul K. Wright, "Toolpath optimization for minimizing airtime during machining." Journal of Manufacturing Systems 22.3 (2003): 173-180.
(Continued)

*Primary Examiner* — Michael A LaFlame, Jr.
(74) *Attorney, Agent, or Firm* — Perry + Currier Inc.

(57) ABSTRACT

A computer-implemented method of generating scan instructions for forming a product using additive layer manufacture as a series of layers is provided. The method comprises determining a beam acceleration voltage to be used when forming the product; for each hatch area of layers of the product, determining a respective beam current to be used when forming the hatch area and providing a respective beam current value to the hatch area description in the scan pattern instruction file; and for each line of each hatch area, determining a respective beam spot size to be used when scanning the beam along the line and providing a respective beam spot size value to the line description in the scan pattern instruction file, and determining a respective series
(Continued)

of beam step sizes and beam step dwell times to be used when scanning the beam along the line, and providing a respective series of beam position values and beam step dwell times to the line description in the scan pattern instruction file thereby defining how the beam is to be scanned along the line. Also provided are a file of scan instructions, an additive layer manufacture apparatus, and a method of forming a product using the additive layer manufacturing apparatus.

14 Claims, 6 Drawing Sheets

(51) Int. Cl.
    *B33Y 50/00*     (2015.01)
    *B23K 26/34*     (2014.01)
    *B23K 15/00*     (2006.01)
    *B33Y 50/02*     (2015.01)
    *B23K 15/02*     (2006.01)
    *G05B 19/4099*     (2006.01)

(52) U.S. Cl.
    CPC .......... *B23K 15/0026* (2013.01); *B23K 15/02* (2013.01); *B33Y 30/00* (2014.12); *B33Y 50/02* (2014.12); *G05B 19/4099* (2013.01); *G05B 2219/35134* (2013.01); *G05B 2219/49007* (2013.01); *G05B 2219/49018* (2013.01)

(56) References Cited

U.S. PATENT DOCUMENTS

| | | |
|---|---|---|
| 2005/0186538 A1 | 8/2005 | Uckelmann |
| 2008/0170112 A1 | 7/2008 | Hull et al. |
| 2011/0165339 A1 | 7/2011 | Skoglund et al. |
| 2015/0174658 A1 | 6/2015 | Ljungblad |
| 2016/0059493 A1 | 3/2016 | Sparks et al. |
| 2016/0370791 A1 | 12/2016 | Revanur et al. |
| 2018/0147784 A1* | 5/2018 | Jiang ...................... B33Y 30/00 |
| 2018/0272613 A1* | 9/2018 | Cieszynski ............. B22F 10/20 |
| 2020/0089826 A1* | 3/2020 | Liu .......................... G06F 30/23 |
| 2021/0311466 A1* | 10/2021 | Yang ........................ B22F 10/28 |

FOREIGN PATENT DOCUMENTS

| | | |
|---|---|---|
| CN | 104588650 A | 5/2015 |
| EP | 2926926 A2 | 10/2015 |
| EP | 3208077 A1 | 2/2017 |
| WO | WO-2015140547 A1 | 9/2015 |
| WO | WO-2016156824 A1 | 10/2016 |
| WO | WO-2016193742 A1 | 12/2016 |

OTHER PUBLICATIONS

Steuben, John C., Athanasios P. Iliopoulos, and John G. Michopoulos. "Implicit slicing for functionally tailored additive manufacturing." Computer-Aided Design 77 (2018): 107-119.

ISA/EP, International Search Report and Written Opinion, dated Apr. 24, 2018, re PCT International Patent Application No. PCT/GB2018/050117.

* cited by examiner

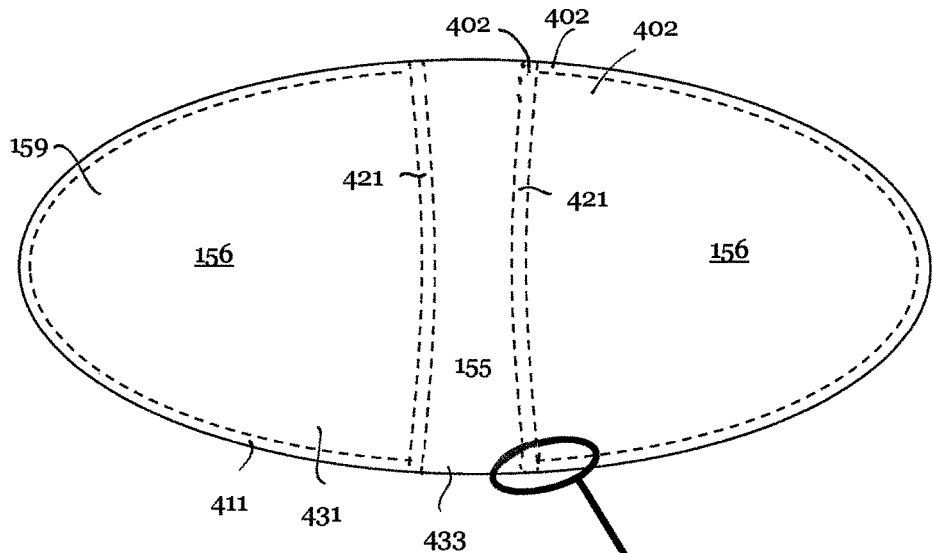
Figure 4
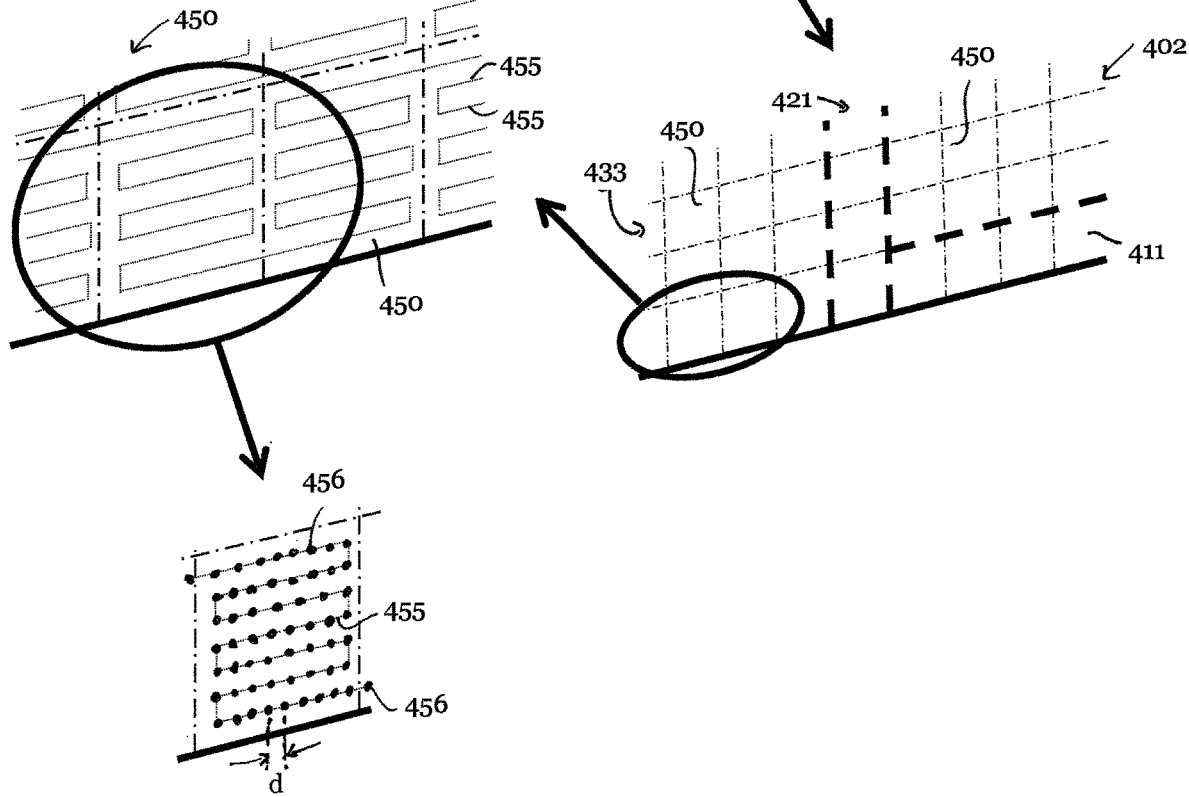

CHARGED PARTICLE BEAM CONTROL DURING ADDITIVE LAYER MANUFACTURE

FIELD OF THE INVENTION

The present invention relates to generating scan instructions for scanning a charged particle beam over a powder bed to form a product using additive layer manufacture. The scan instructions are generated so as to deliver a desired rate of energy to the powder bed through control of the charged particle beam.

BACKGROUND TO THE INVENTION

Additive layer manufacturing is a maturing field. The technique sees energy injected into a substrate medium to alter parts of the substrate, for example to melt, fuse or harden the substrate, so that it forms a layer of a product to be formed. New substrate medium is added and the next layer formed, and so on. In this way, a product may be formed layer-by-layer.

The substrate medium may be selected from many different materials according to need. For example, plastics and metals are commonly used as substrate media. Metal may be provided in powder form from one or more hoppers and spread over a work table to form a powder bed. As each layer is formed, the work table may be lowered by the depth of the powder bed, and a new powder bed deposited on the part-formed product.

The energy source is typically either a laser beam or an electron beam. The present invention is primarily concerned with electron beam sources, although extends to other types of charged particle beams. Such electron beam sources are controlled using electric and/or magnetic fields to steer or condition the electron beam, for example using electromagnetic deflectors. These electromagnetic deflectors allow the electron beam to be scanned across the substrate medium, such that a pattern may be scanned or traced over the substrate medium.

At the design stage, the product to be formed is mapped into XYZ Cartesian coordinates. The product may then be "deconstructed" or "sliced" into the layers that will be formed successively to make the final product. Each layer to be formed is described using XY Cartesian coordinates (the Z coordinate is fixed for each layer). The electromagnetic deflectors are used to scan the electron beam according to a desired path defined using the XY coordinates as an addressable grid. The shape of the layer to be formed in the powder bed is formed by the beam as the beam follows a scan pattern. The scan pattern usually defines simple lines of variable lengths, defined by vectors (for example linking a start point and an end point for each straight line). The layer may be divided into sections, with each section being traced or "hatched" by the electron beam as it is scanned across the powder bed. For example, the outline (i.e. periphery) of the layer may be scanned first and then the hatch areas may be scanned to in-fill the layer. The scan lines, including the hatch areas they form, combine to form the desired shape for the layer.

As the electron beam is scanned over the powder bed, energy is deposited into the powder, raising its temperature. Exposure to the electron beam is carefully controlled to control the rate at which energy is delivered to provide complete melting of the powder. This ensures that the powder particles within the top layer fuse together and so that the powder particles within the top layer also fuse with the previous layer thereby forming a solid product. However, the rate of energy deposition into the powder bed must be controlled to prevent the generation of defects and ensure the correct formation of the material microstructure.

A melt pool forms as the electron beam delivers its energy and as the heat is conducted through the metal powder. Rather than depositing all the required energy into a particular location of the powder bed in one go by controlling the electron beam to dwell at that location, the electron beam is usually scanned continuously within the melt pool. Typically, the electron beam visits a location multiple times. Each time the electron beam passes over a location, the electron beam raises the temperature of that location incrementally until the powder melts. It is also known to form multiple separated melt pools rather than just a single melt pool at any one time.

It is advantageous to be able to control the energy deposited in the powder bed, for example to control the melt characteristics and heat build-up in the powder. The rate of energy deposition into the powder bed as the product is formed may be set by control of the electron beam. For example, it is known to pre-determine beam parameters such as beam energy (e.g. through beam accelerating voltages), beam current, beam spot size and beam scan rate to set the energy deposition rate for the subsequent build process. However, a more flexible method of controlling energy deposition rates would be advantageous.

SUMMARY OF THE INVENTION

From a first aspect, the present invention resides in a computer-implemented method of generating scan instructions for forming a product using additive layer manufacture as a series of layers. Each layer is to be formed by fusing metal powder deposited as a powder bed by scanning a charged particle beam over the powder bed to fuse the metal powder and form a desired layer shape.

The method comprises obtaining a three dimensional description of the product to be formed. For example a file containing the description may be retrieved from memory or may be downloaded from a remote location. Alternatively, the method may comprise generating the three dimensional description, for example by scanning a model of the product such as by using a laser scanner.

The method also comprises taking the description of the shape of the product and generating a scan pattern instruction file that describes how the beam is to be scanned to form the product. To this end, the method comprises decomposing or slicing the shape of the product into a series of layers, generating a layer description for each layer that describes the shape of that layer and adding that to the scan pattern instruction file. For example, the three dimensional description may be provided with reference to an XYZ Cartesian co-ordinate system, and the layer description may provide a description of the shape of the layer in XY coordinates, and may also provide the Z coordinate of the layer.

For each layer, the method may comprise decomposing the shape of the layer into one or more hatch areas to be scanned by the beam, generating a shape description for each hatch area that describes the shape of the hatch area and adding the hatch area descriptions to the scan pattern instruction file. The hatch area descriptions may provide descriptions of the shape of the hatch areas in XY coordinates.

For each hatch area, the method may comprise decomposing the shape of the hatch area into one or more lines to be scanned by the beam, generating a line description for each line and adding the line description to the scan pattern instruction file. Typically, each line description will define a series of lines to be scanned to in-fill the hatch area. For example, the scan lines may define a raster scan. The line descriptions may define a series of beam positions through which the beam is moved. The beam positions may be defined using XY coordinates.

The method comprises determining parameters used to control the charged particle beam as the product is formed. These parameters may set the beam current, beam shape and size and how the beam is steered. These parameters are then added to the scan pattern instruction file.

The method comprises determining a beam acceleration voltage to be used when forming the product and providing a beam acceleration voltage value to the scan pattern instruction file. The beam acceleration voltage may be a voltage set on an electrode or a collection of voltages set of an electrode array that, in either case, set the velocity and hence kinetic energy of the charged particles in the particle beam. A single beam acceleration voltage is set that is used throughout forming the product, i.e. the same value is used at all times as the beam is scanned to form each layer, and the same value is also used for each layer of the product.

For each hatch area, the method comprises determining a beam current to be used when forming the hatch area and providing a beam current value to the hatch area description in the scan pattern instruction file. The beam current value may comprise settings for the charged particle source, for example a filament current where electrons are supplied by thermionic emission from a filament. The beam current value may also comprise other parameters that control the beam current, for example parameters that control a confining magnetic field and/or that control extraction of charged particles to form the particle beam (such as the potential set on a Wehnelt electrode). Thus, the beam current may be varied between hatch areas. That is, the beam current may be varied after one hatch area has been scanned and before the next hatch area is scanned, but maintained at a constant value as each hatch area is scanned. The beam current may be maintained between some hatch areas.

For each line, the method may comprise determining a beam spot size to be used when scanning the beam along the line and providing a beam spot size value to the line description in the scan pattern instruction file. The beam spot size value may comprise parameters set on focusing elements to control the focal point of the beam. For example, the beam spot size value may be settings for focus electrodes that control the focus of the beam. A single beam spot size is provided for each line description. Hence, the spot size may be varied from line to line but is kept constant while scanning along a line. The spot size may be maintained between some lines.

Also for each line, the method may comprise determining a series of beam position values and beam step dwell times to be used when scanning the beam along the line. The beam position values define the size of the step the beam is moved from the current beam position on the powder bed to the next beam position on the powder bed, either directly by specifying the beam step size or indirectly by specifying the next beam position. The beam dwell time is the time the beam is held at each position on the powder bed. The method further comprises providing a series of beam position values and beam step dwell times to the line description in the scan pattern instruction file, thereby defining how the beam is to be scanned along the line. Hence, the beam step size may vary between successive beam positions, even varying for each successive step although the same step size may be maintained for some steps. Similarly, the beam dwell time may vary at successive beam positions, even varying at each successive beam position although the same dwell time may be repeated for some steps. The beam step size and beam dwell time may be set to vary according to some mathematical function, for example to ensure a smooth increase or decrease in the energy delivered by the beam as the beam is scanned along a line. For example, step sizes and/or dwell times may vary linearly or may vary according to a more complex function such as exponentially or according to some other shape such as a Gaussian.

As noted above, each beam position value may correspond to beam co-ordinates that define a beam position on the powder bed, such that successive beam position values set the beam step sizes (i.e. the method comprises determining successive beam positions, thereby implicitly determining beam step sizes). The beam position values may be absolute positions, for example the position of each position of the beam. Alternatively, the beam position values may be relative values, for example to set how far the beam is moved and in which direction the beam is to be moved. The beam position values may comprise settings to be applied to beam deflectors that control the position of the beam, for example voltages or currents to be placed on scanning electrodes or driven through scan coils.

The beam step dwell times may be provided with reference to a clock associated with the computer that is implementing the method. In any event, the computer may be a standalone computer which may or may not directly control an additive layer manufacture apparatus. In the latter case, the scan pattern instruction file may be generated "off-line" and then stored for later retrieval and use by an additive layer manufacture apparatus. Alternatively, the computer may be a processor or other programmable logic element of an additive layer manufacture machine that generates the scan pattern instruction file for immediate use or that stores the file for later use.

The control of the beam acceleration voltage, the beam current, the beam spot size, the beam step size and beam dwell time provides a way of modulating the energy deposited in the powder bed while the build process is performed. The flexibility provided through modulating the energy deposited in the powder bed in this way is advantageous because it allows, for example, control of the melt characteristics and heat build-up in the powder dependent on the feature being melted and the history of that part of the layer. Namely, the modulation allows management of heat distribution in the layer, for example to account for heat distribution already present in the powder bed resulting because some parts of the powder bed are already scanned and heated by the electron beam, and also because heat conduction properties of the metal powder that differ between the unfused and fused states.

The scan pattern instruction file may be generated ahead of the product being formed, for example by assuming operational conditions and generating scan instructions that are expected to produce the best quality in the final product. In addition, real time feedback may be used during the build process to alter some of the parameters during the build. That is, the build may be measured and changes made in light of the measurements.

For example, the energy being deposited into the powder may be assessed, for example by measuring the temperature of the powder bed such as by using a thermal imaging camera. Also, checks may be made for surface irregularities, in the powder bed before melting and/or of the product after each layer is formed. If these measurements reveal anomalies outside an acceptable range, scan parameters may be compensated. This may be performed on a point-by-point basis, a line-by-line basis or a hatch area-by hatch area basis. For instance, if the surface temperature of a location on the product is found to be too hot, the energy delivered to that location in the next layer may be decreased, for example by decreasing the beam dwell time and/or increasing the beam step size for points in that location. These changes may be made "on the fly", i.e. after the parameters have been read from the scan pattern instruction file and before they are applied to the build process. Alternatively, the scan pattern file may be amended such that compensated values are written to the file ahead of the compensated parameters being read from the file and applied to the build process.

The present invention provides a user with the ability to adjust the energy deposition rate quickly and with fine resolution by modulating the beam energy, beam spot size and beam scan rate, throughout the build process. Moreover, the present invention allows for variation in the energy deposition rate on a feature by feature, hatch area by hatch area, line by line and point by point basis. Thus, the present invention provides far greater flexibility than the prior art that merely allows beam parameters to be pre-determined and then maintained at constant values during a build process.

Not only does the present invention provide the user with the ability to control the rate of energy deposition to control the rate of change of material state from a solid to a liquid, but also allows control of the rate of cooling of the material once melted and hence the ability to control and tailor the material microstructure. Moreover, the material microstructure may be controlled on a feature by feature, hatch area by hatch area, line by line and point by point basis.

A further advantage afforded by the present invention relative to the prior art is that the present invention not only proposes a number of beam parameters that may be varied, but also proposes how frequently these values should be varied. Some parameters are varied more frequently than others as this has bene found to produce better results. For example, the beam current may be varied only between hatch areas, whereas the beam dwell time may be varied for each beam position.

It has been realised that changing the beam acceleration voltage dynamically is impractical, although it may be set at the beginning of the build process. Thus, the present invention sets a single beam acceleration voltage value and maintains this throughout the build process.

It has also been appreciated that changing the beam current is a relatively slow process. For example, control of the beam current may be effected through the use of a Wehnelt electrode provided in an electron gun assembly of an additive layer manufacture apparatus. Whilst not allowing particularly dynamic tuning of the beam current, the beam current value may be changed on a less frequent basis, for example for each hatch area.

Changing the beam spot size may be achieved relatively dynamically, for example by using a focusing lens in an electron optical assembly of the additive layer manufacture apparatus. Advantageously, this may be achieved on a line by line basis, although is preferably not implemented on a point by point basis.

Finally, changing the beam scan rate through varying the beam step size and the beam dwell time also changes the energy delivery rate and may be varied very rapidly. As a result, varying the beam step size and beam dwell time may be done on a point by point basis.

In addition to dividing each layer into hatch areas, a division into larger areas may be performed. For example, this may allow certain of the parameters like the beam current and/or beam spot size to be maintained between successive hatch areas. Consequently, the step of decomposing the shape of each layer into one or more hatch areas and generating a shape description for each hatch area may comprise, for each layer, decomposing the shape of the layer into one or more features and generating a feature description for each feature that describes the shape of the feature.

Decomposing the layer into features and hatch areas may be formed with either step being performed first. For example, the layer may be divided into features and then the features may be further divided into hatch areas. Alternatively, the layer may be divided into hatch areas and later areas of adjoining hatch areas may be grouped into features.

In the former case, the layer may be first divided into features according to the nature of different parts of the layer. For example, the edge (periphery) of the layer may be set as a feature or divided into multiple features. This allows beam parameters to be set that are tailored to the fact that the edge of the layer will be bordered by unmelted powder, and can be contrasted to the hatching areas that will generally have bordering areas of melted powder. The rate of energy delivery may also be varied for isolated features in a layer, such as an "overhang" where there is no previously melted powder below that part of the layer. In this situation, a lower rate of energy deposition is required as heat conduction should be limited: for other areas, part of the underlying layer is re-melted to ensure interlayer fusion, whereas this is not desired for an overhanging portion of a layer.

Hence, the step of decomposing the shape of each layer into one or more hatch areas and generating a shape description for each hatch area that describes the shape of the hatch area may comprise, for each layer, decomposing the shape of the layer into one or more features and generating a feature description for each feature that describes the shape of the feature. Then, for each feature, the method may comprise decomposing the shape of the feature into the one or more hatch areas and generating the shape description for each hatch area that describes the shape of the hatch area.

Alternatively, the hatch areas and line descriptions may be generated first, and then grouped into features. For example, hatch areas may be generated and their constituent lines, and the beam spot sizes, beam step sizes and beam step dwell times calculated. With this done, adjacent hatch areas having common values may be grouped together to form a feature, for example by grouping adjacent hatch areas having a common beam spot size into a feature.

Optionally, each line description comprises a spot size value and a series of beam position values with a beam dwell time value provided for each beam position value.

The present invention also resides in a scan pattern instruction file produced according to any of the methods described above. The present invention also resides in a method of forming a product using an additive layer manufacture apparatus, wherein a processor of an additive layer manufacture apparatus accesses such a computer readable file. The method then comprises the processor controlling the additive layer manufacture apparatus to form the product according to the computer readable file by forming the product as a series of layers, each layer being formed by fusing powder deposited as a powder bed by scanning a powder bed using a charged particle beam to form a desired layer shape. The method also comprises, for each layer, fusing the powder by scanning the charged particle beam from beam position to beam position as specified by the beam position values in the line descriptions and holding the beam at each position according to the beam dwell times in the line descriptions thereby scanning the beam along each line and, in turn, scanning the beam over each hatch area to complete the layer.

The present invention also resides in an additive layer manufacturing apparatus comprising a charged particle source, beam forming apparatus operable to form a beam of charged particles from the charged particles provided by the charged particle source and beam steering apparatus. The additive layer manufacturing apparatus further comprises at least one hopper operable to dispense powder and a table positioned to receive the powder dispensed by the at least one hopper in a volume defining a powder bed. The beam steering apparatus is operable to scan the beam over the powder bed. The additive layer manufacturing apparatus also comprises a processor and associated memory having stored therein a computer readable file like the one described above.

The processor is configured to access the computer readable file and to control the additive layer manufacture apparatus to form the product according to the computer readable file by forming the product as a series of layers, each layer being formed by fusing powder deposited as a powder bed by scanning a powder bed using a charged particle beam to form a desired layer shape. For each layer, the processor is configured to fuse the powder by scanning the charged particle beam from beam position to beam position as specified by the beam position values in the line descriptions and by holding the beam at each position according to the beam dwell times in the line descriptions thereby scanning the beam along each line and, in turn, scanning the beam over each hatch area to complete the layer.

BRIEF DESCRIPTION OF THE DRAWINGS

In order that the invention can be more readily understood, reference will now be made by way of example only, to the accompanying drawings in which:

FIG. 2 is a schematic representation of an electron optical assembly operable to provide an electron beam and to scan the electron beam in accordance with embodiments of the present invention, with FIG. 2a corresponding to a side view and FIG. 2b corresponding to a view through line B-B of FIG. 2a;

FIG. 3a is a side view of a product to be made using additive layer manufacture and FIGS. 3b to 3e are plan views of the product as it is being formed on the powder bed, and correspond to when manufacture of the product has reached lines b-b, c-c, d-d and e-e respectively of FIG. 3a;

FIG. 4 is illustrates how the slice of FIG. 3e may be divided into a layer, features and hatch areas.

DETAILED DESCRIPTION OF EMBODIMENTS

Figure 1:
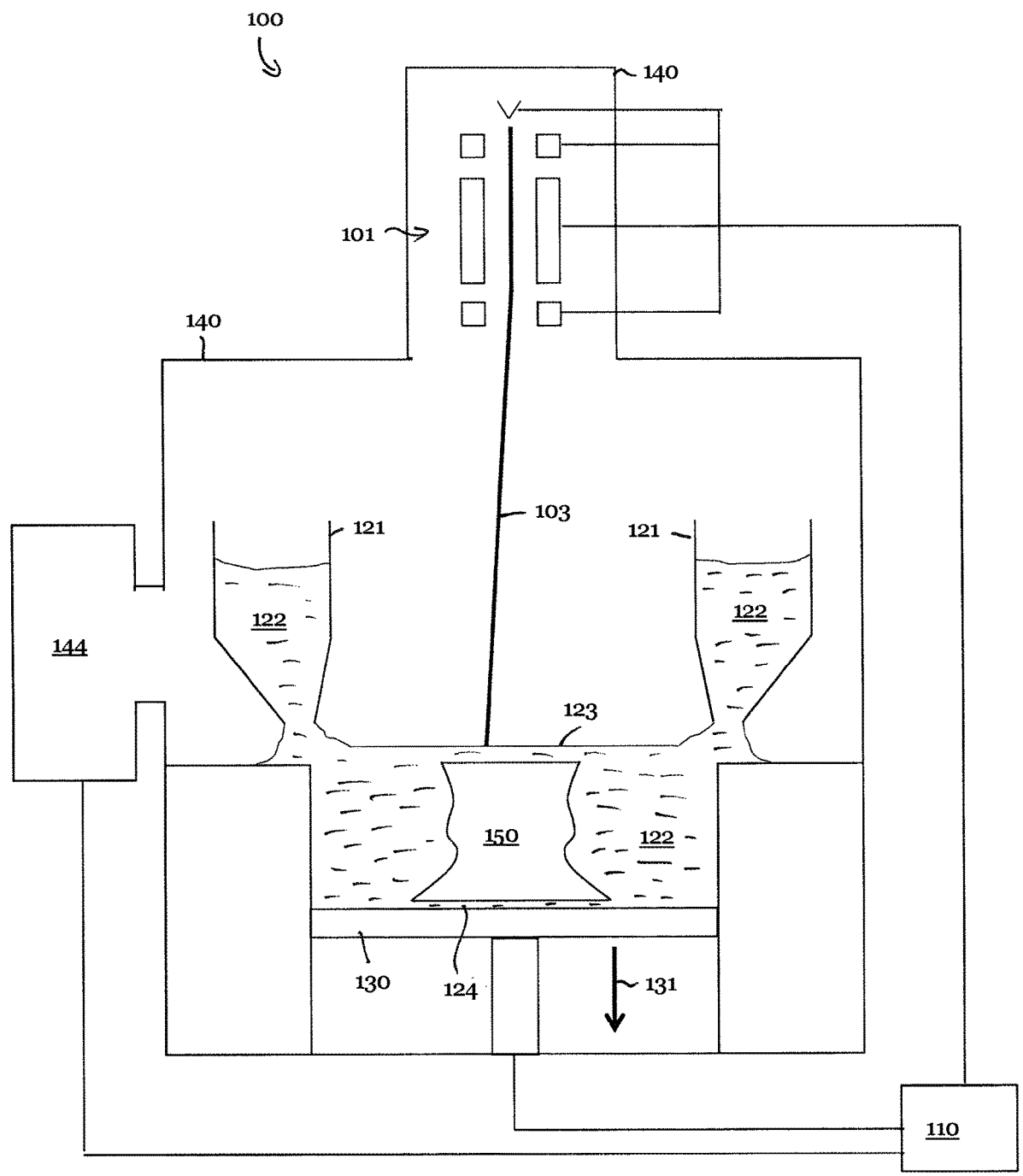
FIG. 1 shows additive layer manufacture apparatus with which the present invention may be used.

FIG. 1 shows additive manufacturing apparatus 100 in which embodiments of the present invention may be implemented. The apparatus 100 is for additive layer manufacture of products from metal powder using an electron beam.

To this end, the apparatus 100 comprises an electron optical assembly 101 that forms, conditions and steers an electron beam 103, as will be described in more detail below. The apparatus 100 further comprises powder hoppers 121 containing metal powder 122 and a movable table 130. The hoppers 121 dispense powder so as to lay down a thin layer of the powder on the table 130. Any number of hoppers 121 may be used, and the two shown in FIG. 1 is but merely an example. A mechanism such as a scraper or blade (not shown) may be used to disperse the powder 122 evenly over the table 130. The electron optical assembly 101 steers the electron beam 103 such that the electron beam 103 is scanned over the powder bed 123 to fuse the powder 122 and form a solid product 150.

After each layer of the product 150 has been formed, the table 130 is lowered in the direction indicated by arrow 131. The table 130 is lowered such that the top surface of the powder bed 123 is always formed at the same height relative to the electron beam 103. The initial layer of the powder bed 123 may be deposited to be thicker than the successive layers to minimise heat conduction to the table 130 which may cause the powder 122 to fuse with the table 130. Thus, a complete layer of unmelted powder 124 is left beneath the product 150 as it is formed.

Additive manufacture using electron beams is generally performed under vacuum conditions, hence the apparatus 100 comprises an enclosing vacuum chamber 140. The vacuum within the vacuum chamber 140 is created and maintained by a pumping system 144, such as any commonly available pumping system, for example a turbomolecular pump backed by a roughing pump. The pumping system 144 may be controlled by the controller 110. As shown in FIG. 1, the pumping system 144 may be used to evacuate the portion of the vacuum chamber 140 housing the electron optical assembly 101. The pressure in the vacuum chamber 140 may be in the range of $1 \times 10^{-3}$ mbar to $1 \times 10^{-6}$ mbar.

Figures 2A, 2B:
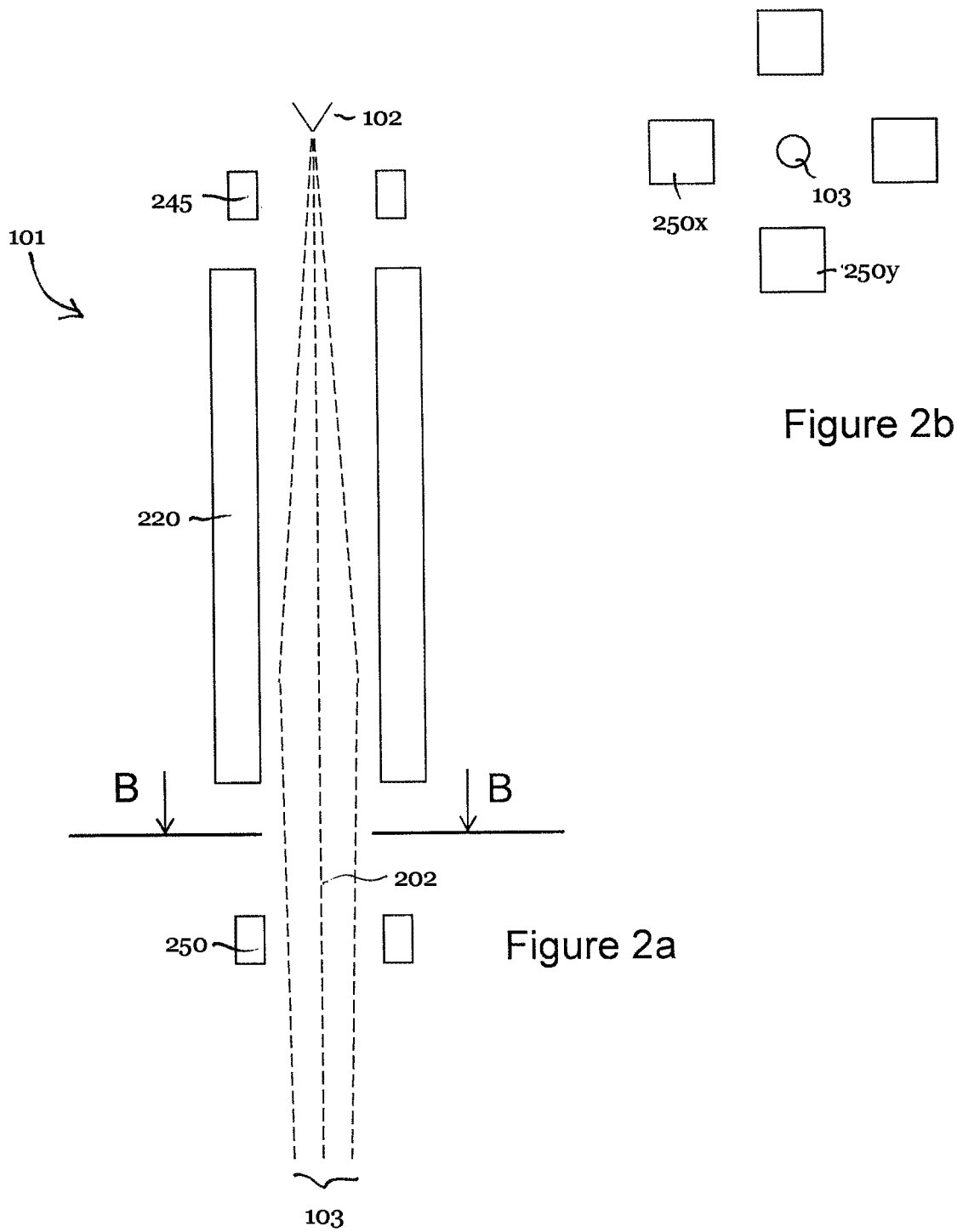

FIGS. 2a and 2b show the electron optical assembly 101 in more detail. The apparatus 100 comprises an electron optical assembly 101 including an electron source 102 for generating electrons, a Wehnelt electrode 245 that assists in extracting and conditioning the electrons from the electron source 102, lenses 220 for further conditioning and forming an electron beam 103 and electromagnetic deflectors 250 for steering the electron beam 103. Operation of the electron source 102 and deflectors 250 is controlled by a controller 110 such as a suitably programmed computer. Any conventional arrangement of electron source 103, Wehnelt electrode 245 and lenses 220 may be used, and so will not be described in detail here.

Essentially, the electron source 103, Wehnelt electrode 245 and lenses 220 deliver a focussed electron beam 103 that is travelling along the central axis 202 of the electron optical assembly 101. Then, the electromagnetic deflectors 250 act to steer the electron beam 103 across the powder bed 123 thereby scanning the electron beam 103 according to a desired scan pattern. The deflectors 250 may be conventional electromagnetic deflectors comprising paired current-carrying coils like Helmholtz coils or conventional electrostatic deflectors comprising paired conductive plates set to appropriate potentials. In either case, the deflectors are operated by the controller 110 to provide the desired deflection, as is well known in the art.

The deflectors 250 act transverse to the path of the electron beam 103 to steer the electron beam 103 away from the central axis 202 (or to keep the electron beam 103 travelling along the central axis 202). This steering is separated into orthogonal components controlled by separate deflectors. Accordingly, the deflectors 250 are provided in orthogonally disposed pairs to effect control of the electron beam 103 in both X and Y coordinates, as shown in FIG.

2b. Hence, there are four elements in the deflector 250. For example, FIG. 2b shows the deflector 250 comprising two Helmholtz coils. A first pair of coils 250x are located to either side of the electron beam 103 and separated in the X coordinate direction thereby allowing the electron beam 103 to be steered in the X direction. A second pair of coils 250y are located to either side of the electron beam 103 and separated in the Y coordinate direction thereby allowing the electron beam 103 to be steered in the Y direction.

The deflector 250 should be able to scan the electron beam 103 over distances such as 0.1 m, 0.2 m, 0.3 m, 0.4 m, 0.5 m or even larger (in both X and Y coordinates, although the X and Y deflection ranges need not be matched to provide square mainfields such that rectangular mainfields may also arise). To provide this deflection range, the deflector 250 may be designed as Helmholtz coils with typically 50 to 100 turns of wire per coil carrying around 1 to 10 A of current, and operating at frequencies around 100 kHz. Alternatively, parallel electrode plates may be used in each axis across which a variable voltage of magnitude of around ±5,000 V would be applied in order to deflect the electron beam 103 in both the positive and negative X and Y directions.

It has been realised that additive manufacture apparatus 100 such as that described above may be used in different ways to control the amount of energy delivered by the electron beam 103 to the powder bed 123. In particular, different parts of the additive manufacture apparatus 100 may provide control of the energy delivery rate and may also provide different response times. The different response times are accommodated by varying different properties of the electron beam 103 with different frequencies. For example, where changes are not particularly dynamic, the changes are made infrequently or are set at the start of the build process and then maintained throughout the build process. Other changes may be made more frequently, at a frequency that suits either the timeframe needed to scan a hatch area or longer, in which case a series of hatch areas may be grouped into a feature of the layer. For example, an edge of the layer may be set to be a feature and scanned with a certain set of beam parameters, before the parameters are changed for the next feature which may be an internal feature away from the edge of the layer. Other changes may be made more frequently still, for example on a line by line or point by point basis.

Examples of how a product 150 may be decomposed into layers, features and hatch areas will now be described with reference to FIGS. 3 and 4.

Figure 3A:
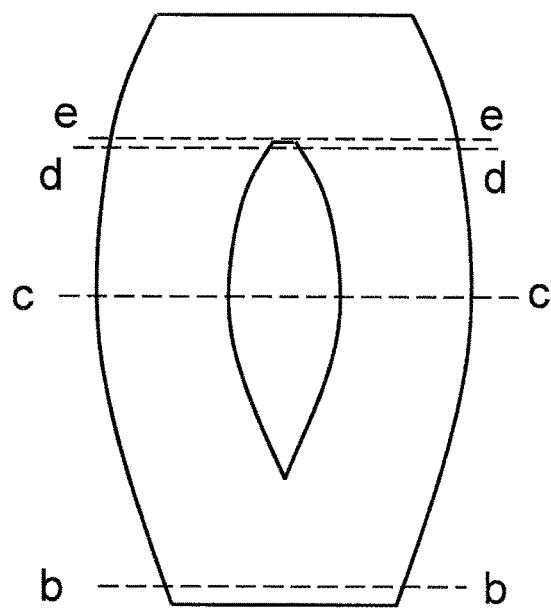
Figure 3B:
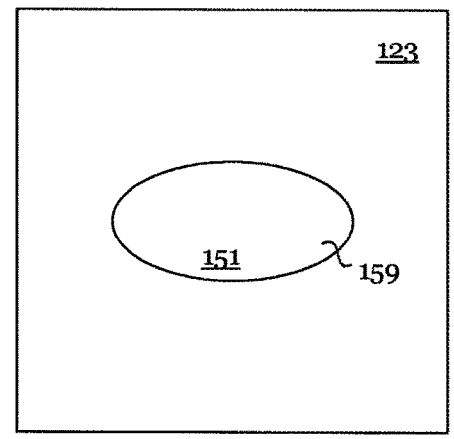
Figure 3C:
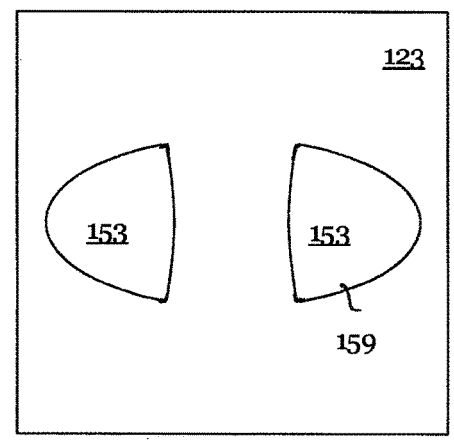

As can be seen from the side view of FIG. 3a, the product comprises a base portion 151, a top portion 152 and two side portions 152 separated by a central aperture 154. Four plan views taken though the product 150 as it is being formed on the powder bed 123 are shown in FIGS. 3b to 3e, with each figure corresponding to when manufacture has reached lines b-b, c-c, d-d and e-e of FIG. 3a respectively. Thus, each of the plan views effectively shows a layer 159 of the product 150 formed by scanning the electron beam 103 according to the scan pattern. FIG. 3b corresponds to a lower layer 159 forming part of the base portion 151 of the product 150. FIG. 3c corresponds to a mid-layer 159 forming part of the middle section of the product where the layer 159 comprises two side portions 153 separated by a gap that will form the aperture 154. Each side portion 153 may be considered as a feature 402 of the layer 159. That is the hatch areas that are scanned to form each side portion 153 in that layer 159 may be grouped to form a feature 402. However, each side portion may be divided into more than one feature 402.

Figure 3D:
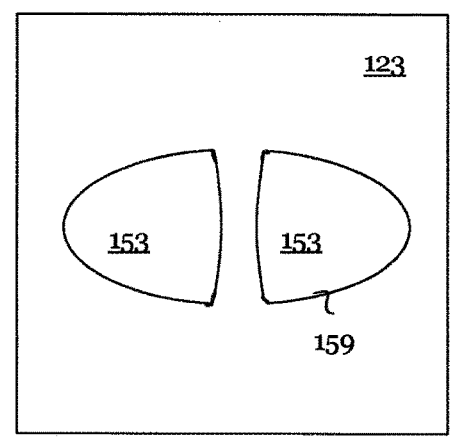
Figure 3E:
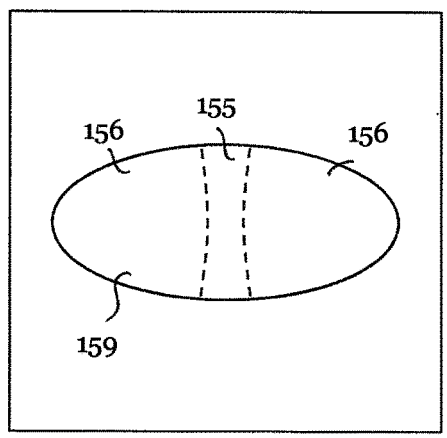

FIGS. 3d and 3e show layers 159 located just below and just above where the aperture 154 ends and the two side portions 153 join to form the top portion 152. Accordingly, FIG. 3d shows a layer 159 from very close to the top of the aperture 154 and so shows a layer 159 comprising two side portions 153. FIG. 3e taken from immediately above where two side portions 153 join to form the top portion 152 and so shows a layer 159 comprising the top portion 152. This layer 159 may be divided into three separate sections. Two end sections 156 are located immediately above the underlying side portions 153 and so the powder 122 to be melted to form these end sections 156 is deposited on previously melted metal powder 122. However, there is also a central overhang section 155 that is located immediately above the underlying aperture 154 and so the powder 122 to be melted to form the overhang section 155 is deposited on unmelted metal powder 122 that was not previously exposed to the electron beam 103.

FIG. 4 shows an exemplary way of dividing the layer 159 of FIG. 3e into features 402 and hatch areas 450. The two end sections 156 and the overhang section 155 of the layer 159 are shown in FIG. 4.

Each end section 156 is divided into an edge feature 411 and an interior feature 431. The edge features 411 extend around the periphery of the layer 159 where the powder 122 is deposited on melted metal from the layer 159 below, but border unmelted powder 122 from the layer 159 below. The interior features 431 correspond to powder deposited on melted metal from the layer 159 below and are well away from any unmelted powder from the layer 159 below. Hence, the heat dissipation away from the edge features 411 and the interior feature 431 will be different, and so different electron beam 103 parameters are used or these different features.

The overhang section 155 is divided into an interior feature 433 and two edge features 421. The edge features 421 border the end sections 156 of the layer 159, and so comprise metal powder 122 deposited on unmelted powder 122 from the layer 159 below but that borders melted powder from the layer 159 below (from the side sections 156 of the layer 159 below). In contrast, the interior feature 433 of the overhang section 155 corresponds to powder deposited on unmelted powder from the layer 159 below and is well away from any melted powder from the layer 159 below. So, the heat dissipation away from the edge features 421 and the interior feature 433 of the overhang section 155 will be different, and so different electron beam 103 parameters are used for these different features 402.

It will be noted that the beam parameters used for the interior feature 433 of the overhang section 155 may be very different from those used for the interior feature 431 of the end sections 156 because the former is surrounded by unmelted powder while the latter is surrounded by melted powder. The beam parameters used for the edge features 421 of the overhang section 155 may or may not be the same as those used for the edge features 411 of the end sections 156.

FIG. 4 also provides an example of how the features 402 may be divided into hatch areas 450, along with the scan lines 455 that are scanned to hatch or in-fill each of the hatch areas 450. In this embodiment, the scan lines 455 form a raster pattern. Certain of the beam parameters may be changed between scan lines 455, as will be described below. The figure shows how the electron beam 103 may be moved between adjacent hatch areas 450. Certain of the beam parameters may be changed between hatch areas 450, as will be described below. Generally, all the hatch areas 450 of one feature 402 will be scanned before the electron beam 103 is moved to another feature 402, and then all the hatch areas 450 of the new feature 402 will be scanned. Certain of the beam parameters may be changed between features 402, as will be described below. The final detail of FIG. 4 also shows how each scan line comprises a series of points 456 corresponding to beam positions. The electron beam 103 is scanned from point to point such that the electron beam 103 is moved along the scan lines 455. That is, potentials or currents are set on the deflectors 250 to deflect the electron beam 103 from the current point 456 to the next point 456. The separation d (see FIG. 4) represents the step size between points 456 and may be varied for each step. Furthermore, the dwell time of the electron beam 103 at each point 456 may also be varied, as will be described in more detail below.

Adjusting various parameters of the electron beam 103 allows the user to adjust the energy deposition rate finely and quickly through modulation of the beam energy, the beam spot size and the beam scan rate. Furthermore, this may be done throughout the build process, and while allowing for variation in process requirements on a feature by feature, shape by shape, line by line and point by point basis. The invention gives the user not only the ability to control the rate and density of energy deposition and hence the rate of change of the powder state from a solid to a liquid, but also allows the user to control the rate of cooling of the metal material once melted and hence provides the ability to control and tailor the material microstructure.

A number of controls are provided to the user to allow the rate of beam energy delivery to the powder bed 123 to be varied. The power of the electron beam 103 may be changed through the user altering either the beam acceleration voltage or the beam current. The beam acceleration voltage may be adjusted by varying the potentials placed on the electron source 102 and surrounding elements, for example the potential difference between the electron source 102 and an acceleration electrode (not shown in the figures). In practice, it has been found that changing the beam acceleration voltage dynamically is impractical. Consequently, according to the present invention, the beam acceleration voltage may be set at the beginning of the build process. Changing the beam current is a relatively slow process and may be effected through the use of the Wehnelt electrode 245 in the electron optical assembly 101. Whilst it has been found that changing the beam current is not particularly dynamic, the beam current value may be set on a feature by feature basis.

It has been found that the beam spot size may be changed dynamically through the use of the focusing lenses 220 in the electron optical assembly 101. This allows fast fine control of the "areal energy" or energy delivered to the powder bed 123 per unit area and may easily be adjusted on a line by line basis.

Changing the scan rate of the electron beam 103 also changes the energy delivery rate to the powder bed. This scan rate of the electron beam 103 may be altered very rapidly and may be done on a shape by shape, line by line and even point by point basis.

By using these techniques, the energy deposited into the powder bed 123 as the electron beam 103 is scanned along each scan line may be varied. It is useful to consider the "linear energy" delivered to the powder bed 123 and this linear energy is defined as the rate at which energy is deposited divided by the rate at which the beam moves along the scan line. This is the power divided by the scan speed, namely $W/ms^{-1}$ or $J/m$.

Figure 5A:
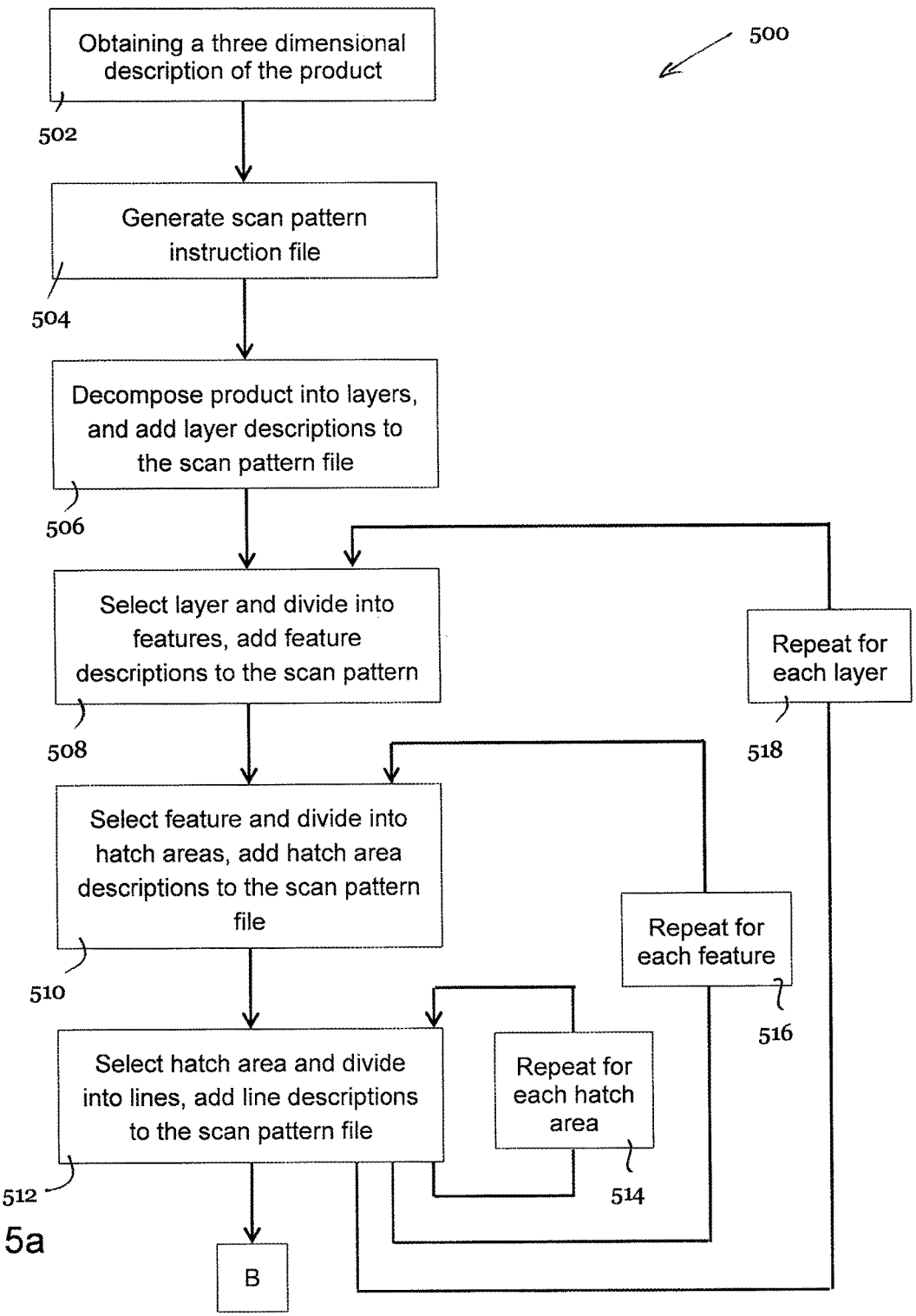
FIG. 5 is a schematic representation of a method of generating scan instructions according to an embodiment of the present invention.
Figure 5B:
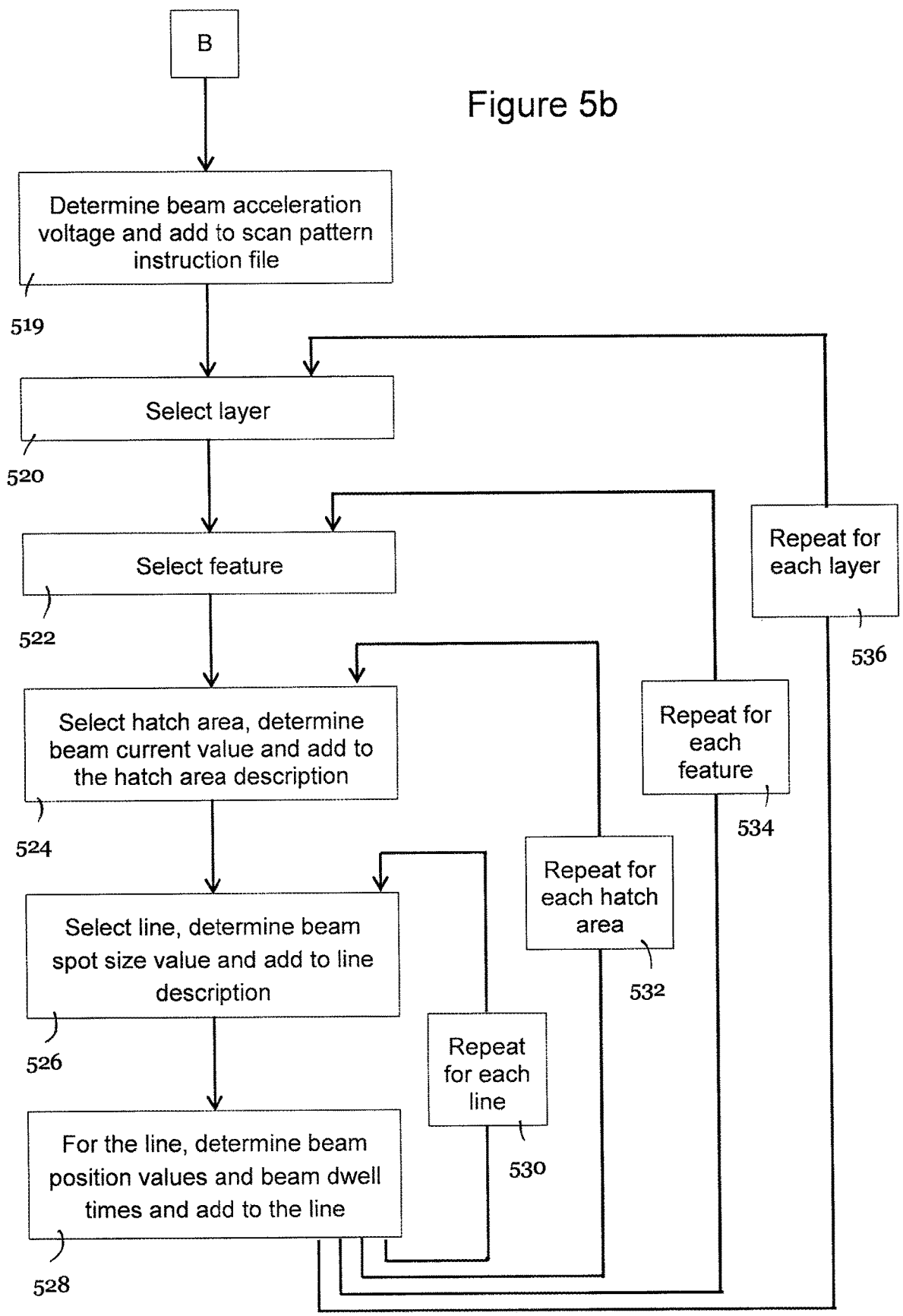

FIGS. 5a and 5b together show a method 500 of generating a scan pattern instruction file. The method starts at step 502 where a computer obtains a three dimensional description of the product 150 to be formed. For example, a user may create a three dimensional model of a product 150 using a CAD program and may save a file that describes the product 150. This file may be retrieved by a computer to obtain a three dimensional description of the product 150 to be formed. The computer may read the file to access the three dimensional description of the product 150. The computer may be the computer 110 described above, or maybe a standalone computer that creates a scan pattern instruction file, and provides that file for use by an additive layer manufacture apparatus 100.

At step 504, the computer generates a scan pattern instruction file and saves the scan pattern instruction file to a memory associated with the computer.

Then, at step 506, the computer takes the three dimensional description of the product 150 and decomposes the shape of the product 150 into a series of layers 159. The computer may choose a suitable layer height for each layer 159, for example based on the overall size of the product 150 or on the fineness of any details that are being formed in a layer 159 of the product 150. These techniques are well known and will not be described further here. The computer then generates a layer description for each layer 159 and writes each layer description to the scan pattern instruction file. This may comprise merely adding a section to the scan pattern description file that identifies the layer 159 and that will have further scan pattern details added to it. Alternatively, the layer description may contain data that describe the shape of the layer 159, for example an outline of the layer 159.

At step 508, the computer selects a layer 159 of the product 150 to be formed and divides that layer 159 into features 402. For example, features 402 may be created for edge regions of the layer 159 and further features 402 created for interior regions of the layer 159. Other features 402 may correspond to overhangs or islands. The computer generates a feature description for each feature 402 and writes it to the layer description of that layer 159. This may comprise merely adding a section to the layer description that identifies the feature 402 and that will have further scan pattern details added to it. Alternatively, the feature description may contain data that describe the shape of the feature 402, for example an outline of the feature 402. It does not matter which layer 159 the computer selects first, although it is preferred for the computer to select the lowest layer 159 first which will be the first layer 159 to be formed during the build process.

Then, at step 510, the computer selects a feature 402 from the current layer 159 and decomposes the shape of the layer 159 into one or more hatch areas 450 to be scanned by the electron beam 103 during the build process. The size of the hatch area 450 may be chosen according to a number of factors, such as the cross-sectional area of the layer 159, the cross-sectional area of the feature 402 and the capabilities of the electron optical assembly 101, as is well known in the art. Then, the computer generates a shape description for each hatch area 450 that describes the shape of the hatch area 450 and writes the hatch area description to the scan pattern instruction file. This may comprise merely adding a section to the feature description that identifies the hatch area 450 and that will have further scan pattern details added to it. Alternatively, the hatch area description may contain data that describe the shape of the hatch area 450, for example an outline of the hatch area 450. It does not matter which feature 402 is selected first.

At step 512, the computer selects a hatch area 450 from the current feature 402 and decomposes the shape of the hatch area 450 into one or more lines 455 to be scanned by the electron beam 103. The lines 455 will effectively fill the hatch area 450, i.e. by scanning the electron beam 103 along the scan lines 455, all the metal powder 122 in the hatch area 450 will be melted. The lines 455 may form a raster scan, as mentioned above. Determining a line pattern, including the line spacing, is well known in the art and so will not be described further. The computer then writes a line description for each line 455 to the hatch area description. This may comprise merely adding a section to the hatch area description that identifies the line 455 and that will have further scan pattern details added to it. Alternatively, the line description may contain data that describe the line 455, for example its start and end points.

With the first hatch area 450 processed in this way, step 512 is repeated for all the other hatch areas in the current feature 402, as indicated by loop 514 of FIG. 5a. The hatch areas 450 may be processed in any order. For example, adjacent hatch areas 450 may be processed sequentially, although in some embodiments it may be advantageous not to process adjacent hatch areas 450 sequentially (i.e. to leave a gap between processing one hatch area 450 and any of the adjacent hatch areas 450). When all hatch areas 450 in the current feature 402 have been processed, the method proceeds along a further loop 516 to select the next feature 402. Thus, this loop 516 ensures that each feature 402 is processed in turn. For each feature 402, step 510 is repeated and step 512 is repeated multiple times due to loop 514. Hence, the method 500 sees each feature 402 divided into hatch areas and each hatch area 450 divided into lines 455.

When all features 402 of the current layer 159 have been processed, the method continues to process all layers 159 in the same way as just described: FIG. 5a shows that the method follows outer loop 518 to ensure all layers 159 are processed. Preferably, the layers 159 are selected in order, starting with the bottom layer 159 that is the first layer 159 formed during the build process, and taking each layer 159 in turn working up through the product 150.

The nested loops 514, 516 and 518 see all layers 159 processed, all layers 159 divided into features 402, all features 402 divided into hatch areas 450, and all hatch areas divided into lines 455. At the end of this process, the scan pattern instruction file contains descriptions of each layer 159. The description of each layer 159 contains a description of each feature 402 of that layer 159, with each feature description containing a description of each of the hatch areas 450 in that feature 402. Every hatch area description contains line descriptions. With the scan pattern instruction file generated in this way, the method may continue to step 519 (the first step of FIG. 5b).

At step 519, the computer determines a beam acceleration voltage to be used for the duration of the build process. The corresponding beam acceleration voltage value is written to the scan pattern instruction file. Examples of the form that the beam acceleration value may take have been provided above.

Next, the computer determines the beam parameters necessary to complete the build process. This is done for all the layers 159, all the features 402, all the hatch areas 450 and all the lines 455. To achieve this, nested loops 530, 532, 534 and 536 are used similarly to nested loops 514, 516 and 518.

The computer processes each layer 159 in turn. Hence, at step 520, the computer selects the first layer 159. As before, the bottom layer 159 is preferably selected first. Outer loop 536 ensures all layers 159 are processed in turn, preferably in order starting with the bottom layer 159 that is the first layer 159 formed during the build process, and taking each layer 159 in turn working up through the product 150.

For each layer 159, the computer selects each feature 402 in turn, as indicated at step 522 and according to loop 534. For each feature 402, the computer selects each hatch area 450 in turn as indicated at step 524 and according to loop 522.

For each hatch area 450, the computer determines a beam current to be used when scanning the hatch area 450 and writes a beam current value to the corresponding hatch area description in the scan pattern instruction file. Thus, each hatch area description contains a single beam current value that is used to set the beam current maintained while the hatch area 450 is being scanned. Examples of how the beam current value may be controlled are given above.

Then, the computer continues to process each line 455 in the hatch area 450. Steps 526, 528 and 530 show the looped line selection process. At each step 526, the computer determines the spot size of the beam 103 for the current line 455. Specifically, the computer determines a beam spot size to be used when scanning the beam 103 along the line 455 and writes a beam spot size value to the line description in the scan pattern instruction file. Hence each line description contains a beam spot size value that is maintained while the line 455 is being scanned. Examples of how the beam spot size may be controlled are given above.

At step 528, the computer determines the scan speed of the beam 103 for the current line. Specifically, the computer determines a series of beam step sizes and beam step dwell times to be used when scanning the beam 103 along the current line 455. The beam step size is the size of the step that the beam 103 is moved from the current beam position to the next beam position. The beam dwell time is the time the beam 103 is held at each position. The computer writes a series of beam position values and beam step dwell times to the line description thereby defining how the beam 103 is to be scanned along the line 455. Examples of how the beam step sizes and beam dwell times may be controlled are given above. As noted above, each beam position value may correspond to beam coordinates that define a beam position on the powder bed 123, such that successive beam position values reflect the determined beam step sizes. The beam step sizes are set in line with the electron beam's spot size. The step size should not be set too large in relation to the spot size in order to prevent irregularities in melting along the line scan. For example, the step sizes may be set to be about the same order of magnitude as the beam spot size.

The beam step size and beam dwell time may be determined independently for each point. Alternatively, the beam step size and beam dwell time may be determined for successive points such that they vary according to some mathematical function. For example, beam step size and/or beam dwell time may be varied to ensure a smooth increase or decrease in the energy delivered by the beam as the beam is scanned along a line. For example, step sizes and/or dwell times may vary linearly or may vary according to a more complex function such as an exponential function or a Gaussian.

When method 500 is completed, a scan pattern instruction file has been created and stored that contains the full instructions required to create the desired product 150 by scanning the electron beam 103 over the powder bed 123 layer by layer. The scan pattern instruction file contains all the beam positions to which the beam 103 must be scanned through, as well as the beam dwell times at each beam position. These beam positions and beam dwell times are organised into scan line descriptions. Each scan line description also contains the beam spot size value to be maintained for that line 455. The line descriptions are also organised into hatch area descriptions. Each hatch area description contains a beam current value to be maintained for that hatch area 450. The hatch area descriptions are organised into feature descriptions. This allows hatch areas with the same or similar beam current values to be grouped together. Finally, the feature descriptions are organised into layer descriptions.

This scan pattern instruction file may then be used by additive layer manufacture apparatus, such as the apparatus 100 described herein, to create a product 150. That is, a controller 110 of the apparatus 100 may read the file and implement the instructions it contains through control of the appropriate parts of the apparatus 100 that control the electron beam 103.

As noted above, real time feedback may be used during the build process to alter some of the parameters during the build. For example, the temperature of the powder bed 123 may be measure by a thermal imaging camera, and parameters altered accordingly. Also, checks may be made for surface irregularities, in the powder bed 123 before melting and/or of the product 150 after each layer is formed. If anomalies are found, such as deviations from expected values outside an acceptable range, scan parameters may be adjusted to compensate for these irregularities. These changes may be made "on the fly", i.e. after the parameters have been read from the scan pattern instruction file and before they are applied to the build process. Alternatively, the scan pattern file may be amended such that compensated values are written to the file ahead of the compensated parameters being read from the file and applied to the build process.

Those skilled in the art will appreciate that variations may be made to the above embodiments without departing from the scope of the invention that is defined by the appended claims.

The invention claimed is:

1. A method of forming a product using an additive layer manufacture apparatus, comprising:
   a processor of an additive layer manufacture apparatus accessing a computer readable file, in which the file comprises:
   a layer description for each layer of the shape of the product that describes the shape of the layer;
   for each layer, the shape of the layer is decomposed into one or more hatch areas to be scanned by the beam, each hatch area having a shape description that describes the shape of the hatch area;
   for each hatch area, the shape of the hatch area is decomposed into one or more lines to be scanned by the beam, each line having a line description;
   a beam acceleration voltage to be used when forming the product;
   for each hatch area, a respective beam current to be used when forming the hatch area;
   for each line,
   (i) a respective beam spot size to be used when scanning the beam along the line,
   (ii) a respective series of beam position values, beam step sizes and beam dwell times to be used when scanning the beam along the line, wherein the beam step size is the size of the step the beam is moved from the current beam position on the powder bed to the next beam position on the powder bed and the beam dwell time is the time the beam is held at each position on the powder bed;
   the processor controlling the additive layer manufacture apparatus to form the product according to the file by forming the product as a series of layers, each layer being formed by fusing powder deposited as a powder bed by scanning a powder bed using a charged particle beam to form a desired layer shape;
   wherein, for each layer, the powder is fused by scanning the charged particle beam from beam position to beam position as specified by the beam position values in the line descriptions and holding the beam at each position according to the beam dwell times in the line descriptions thereby scanning the beam along each line and, in turn, scanning the beam over each hatch area to complete the layer;
   wherein the method comprises dynamically adjusting at least one of the beam spot size, beam step size and beam dwell time from the beam spot size, beam step size and beam dwell time specified in the file in response to assessing energy deposited to the powder.

2. The method of claim 1 wherein comprises:
   for each layer, the shape of the layer is decomposed into one or more features and having a feature description that describes the shape of each feature and;
   for each feature, the shape of the feature is decomposed into the one or more hatch areas and the shape description for each hatch area describes the shape of the hatch area.

3. The method of claim 1, wherein the beam acceleration voltage value is a potential to be set on an acceleration electrode or set of acceleration electrodes that are used to accelerate the charged particle beam.

4. The method claim 1, wherein each beam current value is a value to be set on a charged particle source to control the rate of charged particle production of the source.

5. The method of claim 4, in which the beam current value is a value to be set on an electrical current to be passed through a filament of the source, or an electrical potential set on a Wenhelt electrode.

6. The method claim 1, wherein each beam spot size value comprises one or more settings for focus electrodes or focus coils that are operable to focus the charged particle beam and set the size of the beam on the powder bed.

7. The method claim 1, wherein each beam position value corresponds to beam co-ordinates that define a beam position on the powder bed, such that successive beam position values reflect the determined beam step sizes.

8. The method of claim 7, wherein each beam position value comprises either deflector potentials to be placed on deflector electrodes to set the beam to the desired beam position on the powder bed, or currents to be passed through deflector coils to set the beam to the desired beam position on the powder bed.

9. The method claim 1, wherein each line description comprises a spot size value and a series of beam position values with a beam dwell time value provided for each beam position value.

10. The method claim 1, comprising adjusting the beam current from the beam current specified in the file in response to assessing energy deposited to the powder.

11. The method claim 1, comprising:
    obtaining a three dimensional description of the product to be formed;
    decomposing the shape of the product into a series of layers, generating a layer description for each layer that describes the shape of the layer and adding the layer descriptions to a scan pattern instruction file;

for each layer, decomposing the shape of the layer into one or more hatch areas to be scanned by the beam, generating a shape description for each hatch area that describes the shape of the hatch area and adding the hatch area description to the scan pattern instruction file;

for each hatch area, decomposing the shape of the hatch area into one or more lines to be scanned by the beam, generating a line description for each line and adding the line description to the scan pattern instruction file;

determining a beam acceleration voltage to be used when forming the product and providing a beam acceleration voltage value to the scan pattern instruction file;

for each hatch area, determining a respective beam current to be used when forming the hatch area and providing a respective beam current value to the hatch area description in the scan pattern instruction file;

for each line,
  (i) determining a respective beam spot size to be used when scanning the beam along the line and providing a respective beam spot size value to the line description in the scan pattern instruction file,
  (ii) determining a respective series of beam step sizes and beam dwell times to be used when scanning the beam along the line, wherein the beam step size is the size of the step the beam is moved from the current beam position on the powder bed to the next beam position on the powder bed and the beam dwell time is the time the beam is held at each position on the powder bed, and providing a respective series of beam position values and beam step dwell times to the line description in the scan pattern instruction file thereby defining how the beam is to be scanned along the line.

12. The method of claim 11, further comprising saving to a computer memory a file containing the product description, the layer descriptions, the hatch area descriptions for each layer, the line descriptions for each hatch area.

13. An additive layer manufacturing apparatus comprising:
  a charged particle source;
  beam forming apparatus operable to form a beam of charged particles from the charged particles provided by the charged particle source;
  beam steering apparatus;
  at least one hopper operable to dispense powder;
  a table positioned to receive the powder dispensed by the at least one hopper in a volume defining a powder bed, and wherein the beam steering apparatus is operable to scan the beam over the powder bed; and
  a processor and associated memory,
  the memory having stored therein a computer readable file;
  wherein the file comprises:
    a layer description for each layer of the shape of the product that describes the shape of the layer;
    for each layer, the shape of the layer is decomposed into one or more hatch areas to be scanned by the beam, each hatch area having a shape description that describes the shape of the hatch area;
    for each hatch area, the shape of the hatch area is decomposed into one or more lines to be scanned by the beam, each line having a line description;
    a beam acceleration voltage to be used when forming the product;
    for each hatch area, a respective beam current to be used when forming the hatch area;
    for each line,
      (i) a respective beam spot size to be used when scanning the beam along the line,
      (ii) a respective series of beam position values, beam step sizes and beam step dwell times to be used when scanning the beam along the line, wherein the beam step size is the size of the step the beam is moved from the current beam position on the powder bed to the next beam position on the powder bed and the beam dwell time is the time the beam is held at each position on the powder bed; and
  the processor being configured to access the file and to control the additive layer manufacture apparatus to form the product according to the file by forming the product as a series of layers, each layer being formed by fusing powder deposited as a powder bed by scanning a powder bed using a charged particle beam to form a desired layer shape;
    wherein, for each layer, the powder is fused by scanning the charged particle beam from beam position to beam position as specified by the beam position values in the line descriptions and holding the beam at each position according to the beam dwell times in the line descriptions thereby scanning the beam along each line and, in turn, scanning the beam over each hatch area to complete the layer;
  wherein the processor is configured to dynamically adjust at least one of the beam spot size, beam step size and beam dwell time from the beam spot size, beam step size and beam dwell time specified in the file in response to assessing energy deposited to the powder.

14. The method of claim 2, wherein the beam acceleration voltage value is a potential to be set on an acceleration electrode or set of acceleration electrodes that are used to accelerate the charged particle beam.

* * * * *